(12) United States Patent
Mahanpour et al.

(10) Patent No.: US 6,960,802 B1
(45) Date of Patent: Nov. 1, 2005

(54) PERFORMING PASSIVE VOLTAGE CONTRAST ON A SILICON ON INSULATOR SEMICONDUCTOR DEVICE

(75) Inventors: Mehrad Mahanpour, Union City, CA (US); Mohammad Massoodi, Los Altos, CA (US); Dokham Phengthirath, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 59 days.

(21) Appl. No.: 10/663,614

(22) Filed: Sep. 16, 2003

(51) Int. Cl.[7] .................... H01L 27/108; H01L 21/66; H01L 21/00
(52) U.S. Cl. .................... 257/300; 257/350; 257/368; 438/14; 438/18; 438/149; 438/479; 438/517
(58) Field of Search ................ 438/14, 17, 18, 438/149, 479, 517; 324/71.1; 257/300, 350, 257/368

(56) References Cited

U.S. PATENT DOCUMENTS 6,108,121 A * 8/2000 Mansell et al. ............. 359/291
6,236,222 B1   5/2001 Sur, Jr. et al. ............. 324/758
6,812,050 B1 * 11/2004 Ramappa .................... 438/17

* cited by examiner

Primary Examiner—Hsien Ming Lee
(74) Attorney, Agent, or Firm—Winstead Sechrest & Minick P.C.

(57) ABSTRACT

A method and type of device for performing passive voltage contrast on a silicon on insulator (SOI) device. A first portion of a substrate of the SOI device may be ground with a dimpler. A second portion of the substrate of the SOI device may be etched using tetramethylammonium hydroxide (TMAH). A third portion of the substrate of the SOI device and a portion of a box insulator of the SOI device may be etched using hydrofluoric (HF) acid. A conductive coating may be applied to the etched portions thereby forming a conductive path from the gate to the substrate if there is a breakdown in the gate oxide. Consequently, the passive voltage contrast technique may be applied to the SOI device to detect a breakdown in the gate oxide which would be illustrated by a bright area in the gate oxide region resulting from the secondary electrons produced.

22 Claims, 5 Drawing Sheets

PERFORMING PASSIVE VOLTAGE CONTRAST ON A SILICON ON INSULATOR SEMICONDUCTOR DEVICE

TECHNICAL FIELD

The present invention relates to the field of silicon on insulator (SOI) semiconductor devices, and more particularly to performing passive voltage contrast on a SOI semiconductor device.

BACKGROUND INFORMATION

Semiconductor chips are used in many applications, including as integrated circuits and as flash memory for computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices. Moreover, it is desirable that the devices operate at very fast speeds.

Among the things that can limit the speed with which semiconductor devices operate is extraneous capacitances in the devices. More specifically, undesired electrical capacitance can arise from the portions of the source and drain regions that overlap the gate region, as well as from the source and drain junctions. To limit junction depth and, hence, to decrease junction capacitance, so-called "silicon on insulator" ("SOI") technology, can be used in which a layer of oxide is buried in the silicon substrate to act as a stop to dopant diffusion (and, hence, to act as a stop to source/drain junction depth).

On top of this layer of oxide may reside a silicon region, commonly referred to as the "body." In the body, active regions, e.g., source and/or drain junctions, and shallow trench isolation (STI) regions may be formed. On top of the body, a polysilicon gate may be separated from the body by a layer of gate oxide. However, if the gate oxide breaks down, a conductive path is formed between the gate and the channel or body. This may result in shifts in the threshold voltage from charge trapping thereby resulting in the defective operation of the SOI device.

One method for detecting defects, such as a gate oxide breakdown, is passive voltage contrast. In the passive voltage contrast technique, a scanning electron microscope (SEM) may direct electrons to an integrated circuit or wafer placed on a stage in a vacuum chamber. Upon directing electrons onto the test circuit or wafer, secondary electrons may be produced. These secondary electrons may be produced by interconnected structures. That is, secondary electrons may be produced when there is a conductive path for electrons to flow. The areas of a conductive path may be brighter than the areas in which there is not a conductive path based on the amount of secondary electrons produced. By determining if the area around the gate oxide region is dark or bright, a determination may be made as to whether there is a breakdown in the gate oxide region. If there is a breakdown in the gate oxide region, then the area will appear to be bright. The area will appear bright since a conductive path has been formed from the gate to the channel thereby resulting in secondary electrons being produced. If there is not a breakdown in the gate oxide region, then the area will appear dark.

However, the passive voltage contrast technique has not been able to be applied to detect breakdowns in the gate oxide regions in SOI semiconductor devices because SOI devices have included an insulator between the body and the substrate. This insulator prevents a conductive path forming from the gate to the substrate even when there is a breakdown in the gate oxide. Hence, the passive voltage contrast technique may indicate a dark area even when there is a breakdown in the gate oxide. Consequently, the passive voltage contrast technique cannot currently be performed on SOI semiconductor devices to detect a breakdown in the gate oxide. Similarly, the passive voltage contrast technique cannot currently be preformed on SOI semiconductor devices to detect an open contact since closed contacts would appear to be open as the insulator in the SOI semiconductor device prevents a conductive path forming from the contact to the substrate.

Therefore, there is a need in the art to be able to perform passive voltage contrast on an SOI semiconductor device to detect a breakdown in the gate oxide as well as to detect open contacts.

SUMMARY

The problems outlined above may at least in part be solved in some embodiments by grinding and etching portions of the bulk substrate and box insulator of the silicon on insulator (SOI) semiconductor device, thereby allowing a conductive path to form between the gate and the substrate if there is a breakdown in the gate oxide. Further, a conductive path may also be formed between the contact and the substrate. Consequently, the passive voltage contrast technique may be applied to a SOI device to detect a breakdown in the gate oxide as well as to detect an open contact.

In one embodiment of the present invention, a method for performing passive voltage contrast on a silicon on insulator (SOI) device may comprise the step of grinding a first portion of a substrate of the SOI device with a dimpling tool. The method may further comprise etching a second portion of the substrate of the SOI device with tetramethlyammonium hydroxide (TMAH) following the grinding of the SOI device with the dimpling tool. The method may further comprise etching a third portion of the substrate and a portion of a box insulator of the SOI device with hydrofluoric (HF) acid following the etching of the SOI device with TMAH. The method may further comprise applying a conductive coating to the etched portions of the substrate and the box insulator of the SOI device. Further, the conductive coating may be applied to a portion of a body of the SOI device. The method may further comprise directing a beam of electrons at the SOI device to detect a secondary emission from the SOI device.

The foregoing has outlined rather generally the features and technical advantages of one or more embodiments of the present invention in order that the detailed description of the invention that follows may be better understood. Additional features and advantages of the invention will be described hereinafter which may form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

The present invention comprises a method and type of SOI device that enables performing passive voltage contrast on SOI devices. In one embodiment of the present invention, a first portion of a substrate of the SOI device may be ground with a dimpling tool. A second portion of the substrate of the SOI device may be etched using tetramethylammonium hydroxide (TMAH). A third portion of the substrate of the SOI device and a portion of a box insulator of the SOI device may be etched using hydrofluoric (HF) acid. By grinding and etching portions of the substrate and box insulator, a conductive path may now be formed by applying a conductive material shorting the transistor body to the SOI substrate. Consequently, the passive voltage contrast technique may be applied to the SOI device of the present invention to detect a breakdown in the gate oxide which would be illustrated by a bright area in the gate oxide region resulting from the secondary electrons produced. If there is not a breakdown in the gate oxide, then the gate oxide region will appear dark as there will not be a conductive path formed from the gate to the ground level of the SOI device. Further, the passive voltage contrast technique may be applied to the SOI device to detect an open contact which would be illustrated by a dark area around the defective contact region resulting from the lack of secondary electrons produced. If there is not an open contact, then the area around the contact region will appear bright as there will be a conductive path formed from the contact to the active area of the body of the SOI device.

It is noted that the present invention will be described in terms of certain semiconductor devices and certain structures within the semiconductor devices. However, the present invention is applicable to the testing of other semiconductor devices and/or additional or different structures. One of ordinary skill in the art will also readily recognize that for clarity, only certain portions of the semiconductor devices are depicted.

FIG. 1-SOI Device

Figure 1:
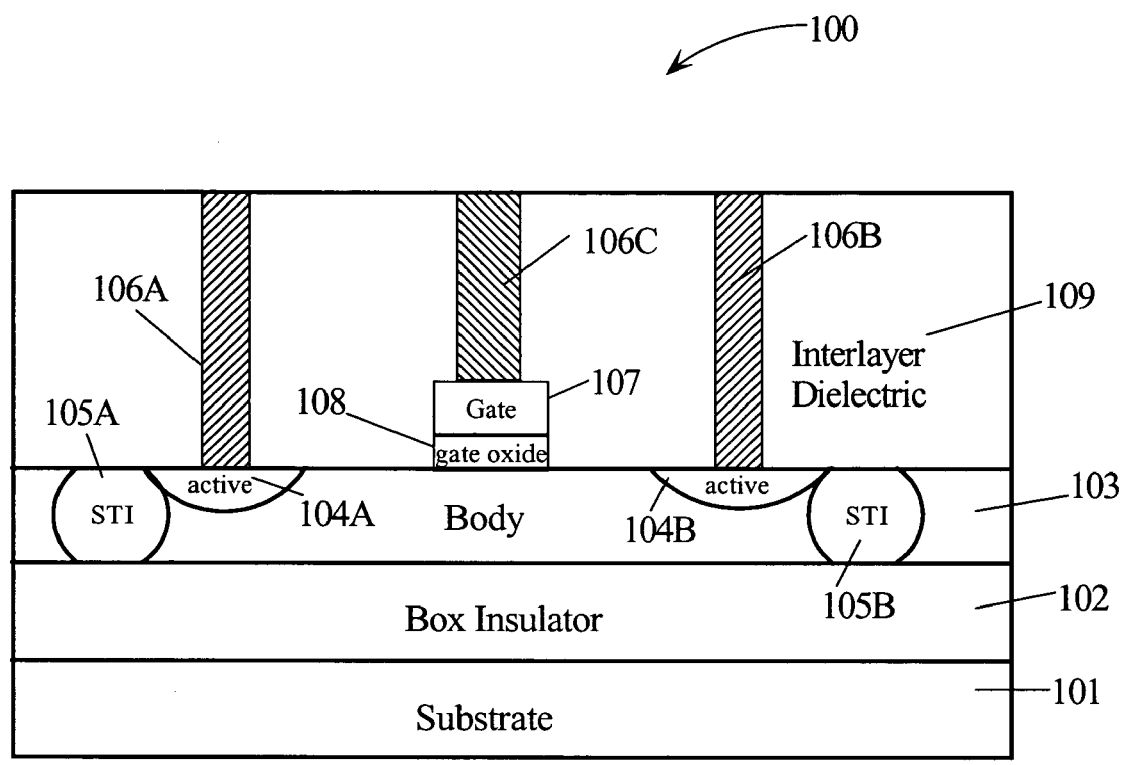
FIG. 1 illustrates an embodiment of the present invention of a silicon on insulator (SOI) device.

FIG. 1 illustrates an embodiment of a semiconductor on insulator (SOI) semiconductor device 100 in accordance with the present invention. SOI device 100 may reside on bulk silicon 101 referred to as the "substrate." SOI device 100 may further comprise a layer of oxide 102, referred to as the "box insulator," residing on the bulk silicon 101. In one embodiment, oxide 102 may be composed of $SiO_2$. On top of box insulator 102 may reside a silicon region, referred to as the "body" 103. Body 103 may include active regions 104A–104B, e.g., source/drain junctions, and shallow trench isolation (STI) regions 105A–105B. Active regions 104A–B may collectively or individually be referred to as active regions 104 or active region 104, respectively. STI regions 105A–105B may collectively or individually be referred to as STI regions 105 or STI region 105, respectively. Active regions 104A–104B may be interconnected to metal-1 layer (not shown) via contacts 106A–106B, respectively. Further, the top of SOI device 100 may be interconnected with a polysilicon gate 107 via contact 106C. Contacts 106A–106C may collectively or individually be referred to as contacts 106 or contact 106, respectively. In one embodiment, contacts 106 may be comprised of tungsten. Polysilicon gate 107 may be separated from body 103 by a gate oxide 108. Contacts 106, polysilicon gate 107 and gate oxide 108 may be interposed by an interlayer dielectric 109. It is noted that SOI device 100 may comprise any number of contacts 106, active regions 104, STI regions 105, gates 107 and gate oxide regions 108, and that FIG. 1 is illustrative.

As stated in the Background Information section, the passive voltage contrast technique has not been able to be applied to detect breakdowns in the gate oxide regions in SOI semiconductor devices because SOI devices have included an insulator between the body and the substrate. This insulator prevents a conductive path forming from the gate to the substrate even when there is a breakdown in the gate oxide. Hence, the passive voltage contrast technique may indicate a dark area even when there is a breakdown in the gate oxide. Consequently, the passive voltage contrast technique has not been able to be performed on SOI semiconductor devices to detect either a breakdown in the gate oxide. Similarly, the passive voltage contrast technique has not been able to be preformed on SOI semiconductor devices to detect an open contact as closed contacts would appear to be open as the insulator in the SOI semiconductor device has prevented a conductive path forming from the contact to the substrate. Therefore, there is a need in the art to be able to perform passive voltage contrast on an SOI semiconductor device to detect a breakdown in the gate oxide as well as to detect open contacts.

Figure 2:
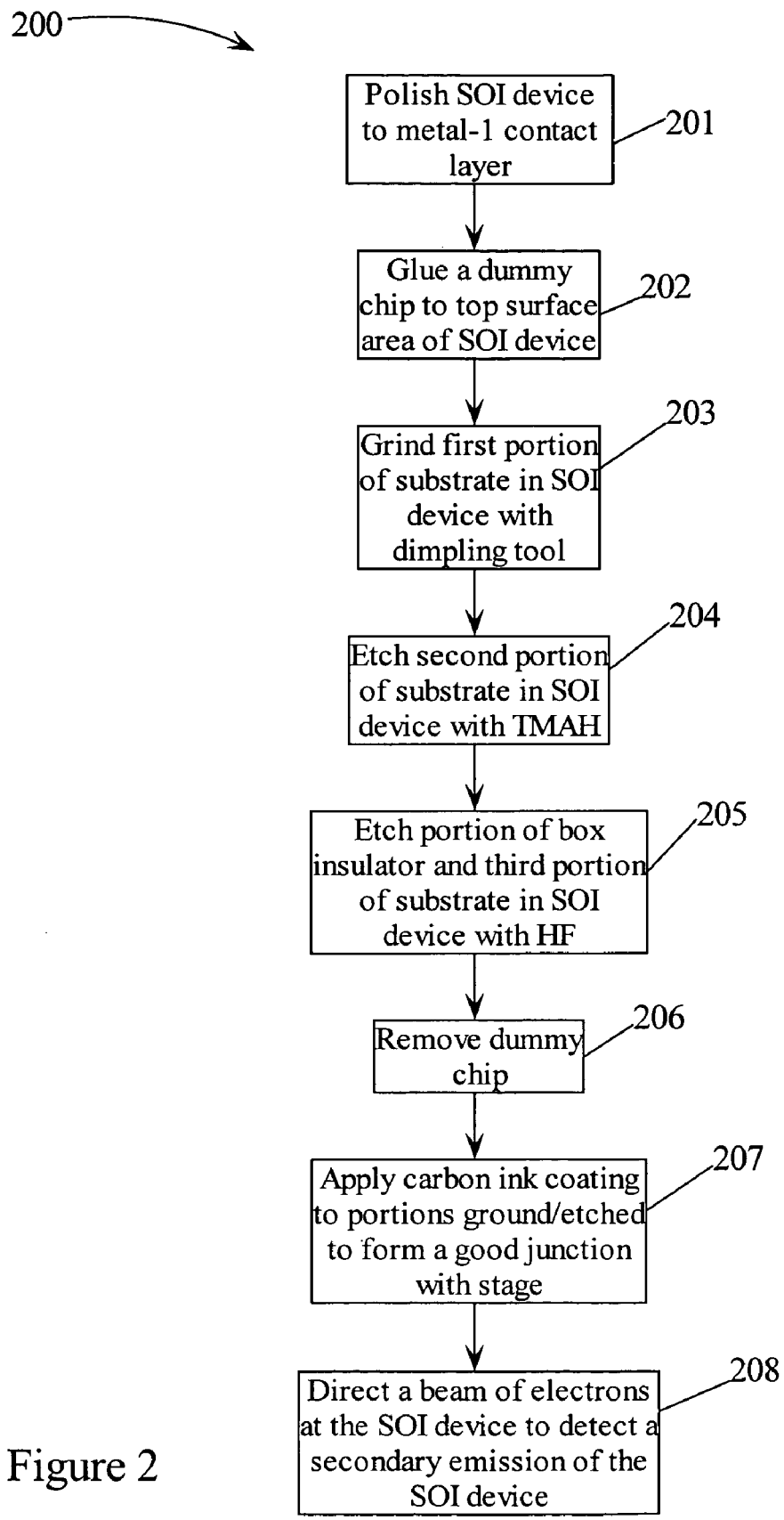
FIG. 2 is a flowchart of a method for performing passive voltage contrast on the SOI device in accordance with an embodiment of the present invention.

A method for performing passive voltage contrast on SOI device 100 to detect a breakdown in gate oxide 108 as well as to detect a contact 106 that is open is discussed below in conjunction with FIG. 2. FIGS. 3A–3D, as discussed further below in conjunction with FIG. 2, illustrate embodiments of SOI device 100 after the steps of etching the substrate using a dimpler, etching the substrate using tetramethylammonium hydroxide (TMAH), etching the substrate and box insulator using hydrofluoric acid (HF) are performed, and applying carbon ink are performed, respectively. FIG. 4, as discussed further below in conjunction with FIG. 2, illustrates an embodiment of the present invention of a passive voltage contrast chamber used for detecting a breakdown in the gate oxide of the SOI device as well as for detecting a contact 106 that is open.

FIG. 2-M*ethod* for Performing Passive Voltage Contrast on a SOI Device

FIG. 2 is a flowchart of one embodiment of the present invention of a method 200 for performing passive voltage contrast on SOI device 100 (FIG. 1).

Referring to FIG. 2, in conjunction with FIG. 1, in step 201, SOI device 100 is polished to metal-1 contact layers 106.

In step 202, a dummy integrated circuit is glued to the top surface of SOI device 100 to protect the top surface structures of SOI device 100 from inadvertent or undesirable etching. The dummy integrated circuit may be glued to the top surface of SOI device 100 using a commercially available conventional epoxy.

Figure 3A:
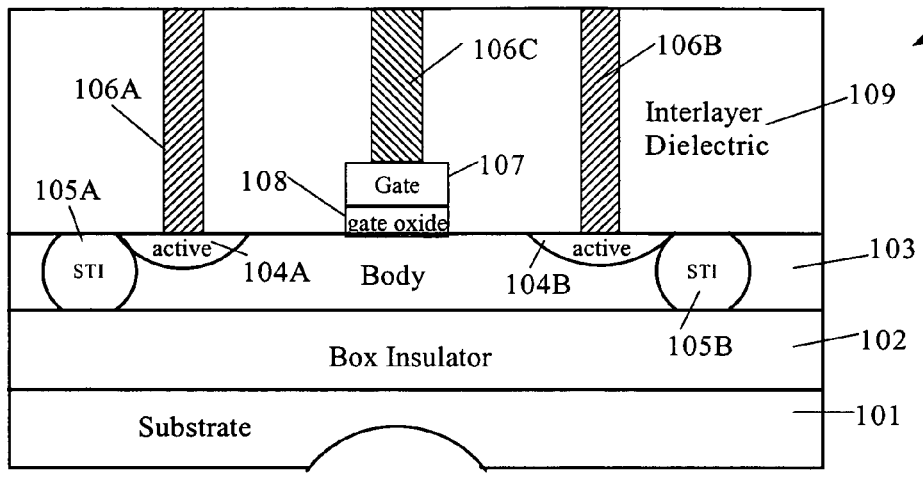
FIG. 3A illustrates an embodiment of the present invention of the SOI device after the step of grinding the substrate using a dimpling tool.
Figure 4:
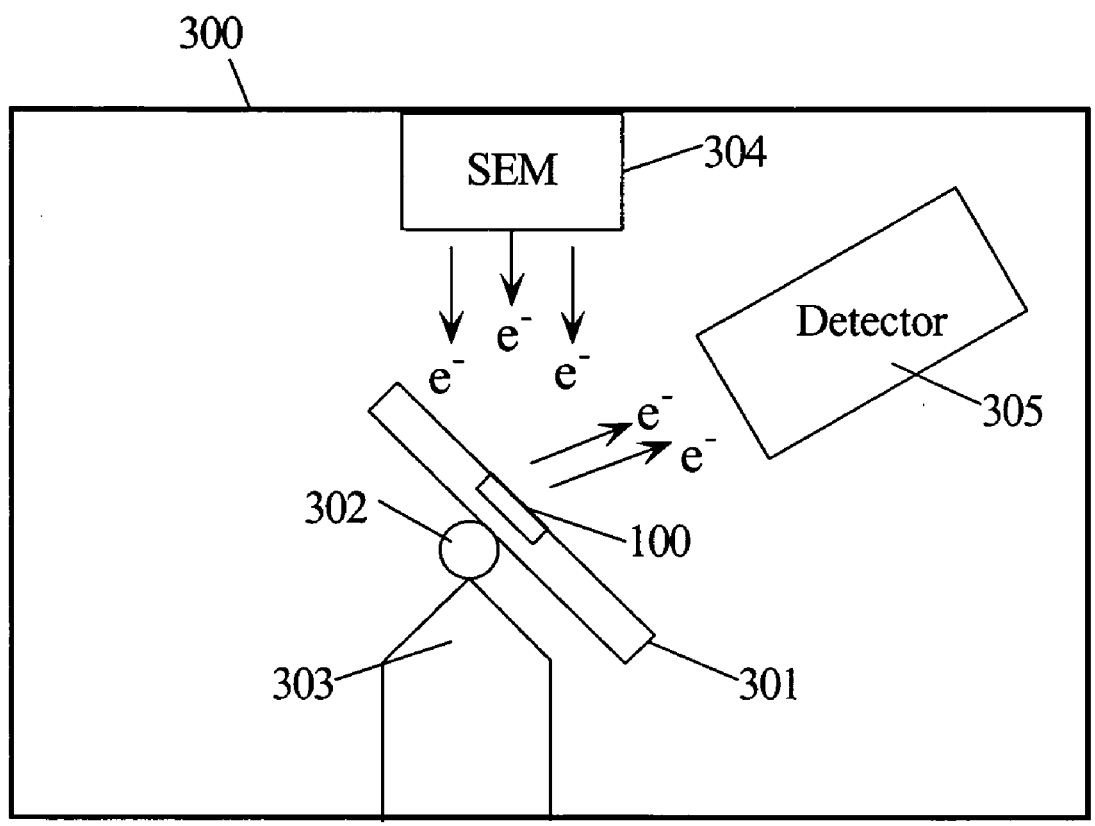
FIG. 4 illustrates an embodiment of the present invention of a passive voltage contrast chamber used for detecting a breakdown in the gate oxide of the SOI device.

In step 203, a first portion of substrate 101 is ground with a dimpling tool in the area below gate 107 as illustrated in FIG. 3A. Referring to FIG. 3A, FIG. 3A illustrates an embodiment of the present invention of SOI device 100 where a portion of substrate 101 has been ground by a dimpling tool.

Figure 3B:
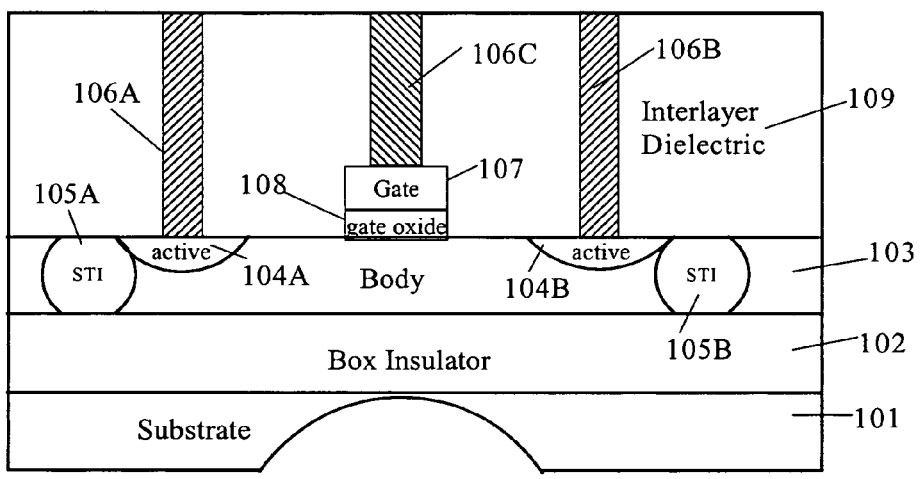
FIG. 3B illustrates an embodiment of the present invention of the SOI device after the step of etching the substrate using tetramethylammonium hydroxide (TMAH)

Returning to FIG. 2, in conjunction with FIG. 1, in step 204, a second portion of substrate 101 is etched with tetramethylammonium hydroxide (TMAH) in the area below gate 107 as illustrated in FIG. 3B. Referring to FIG. 3B, it illustrates an embodiment of the present invention of SOI device 100 where a second portion of substrate 101 has been etched by TMAH. The etching by TMAH should stop at box insulator 102 as TMAH does not etch oxide material.

Figure 3C:
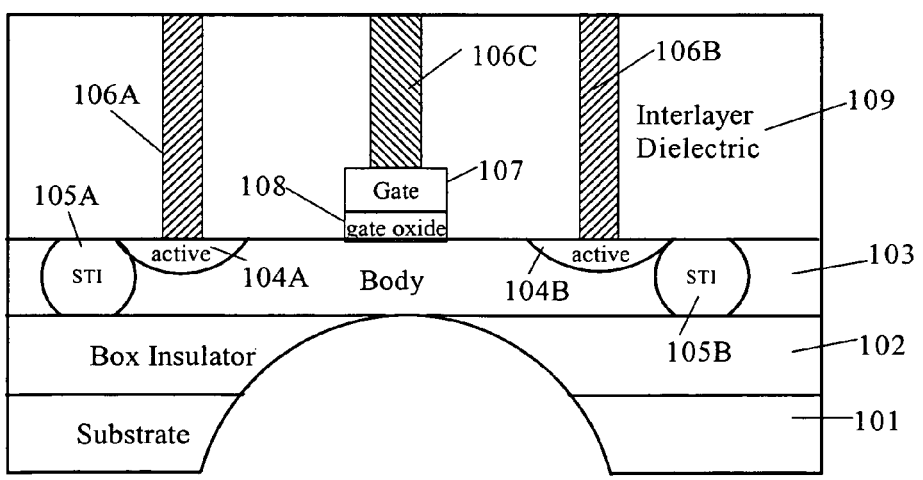
FIG. 3C illustrates an embodiment of the present invention of the SOI device after the step of etching the substrate with TMAH and box insulator using hydrofluoric (HF) acid.

Returning to FIG. 2, in conjunction with FIG. 1, in step 205, a third portion of substrate 101 and a portion of box insulator 102 are etched in the area below gate 107 using hydrofluoric (HF) acid. In one embodiment, the HF acid may etch box insulator 102 up to the border with body 103 but not including body 103 as illustrated in FIG. 3C. Referring to FIG. 3C, it illustrates an embodiment of the present invention of SOI device 100 where a third portion of substrate 101 and a portion of box insulator 102 has been etched by HF acid. Etching using HF acid may require careful attention as such etching for too long a time may cause an interaction with body 103.

Returning to FIG. 2, in conjunction with FIG. 1, in step 206, the dummy integrated circuit, that was glued to the top surface of SOI device 100 in step 202, is removed.

Figure 3D:
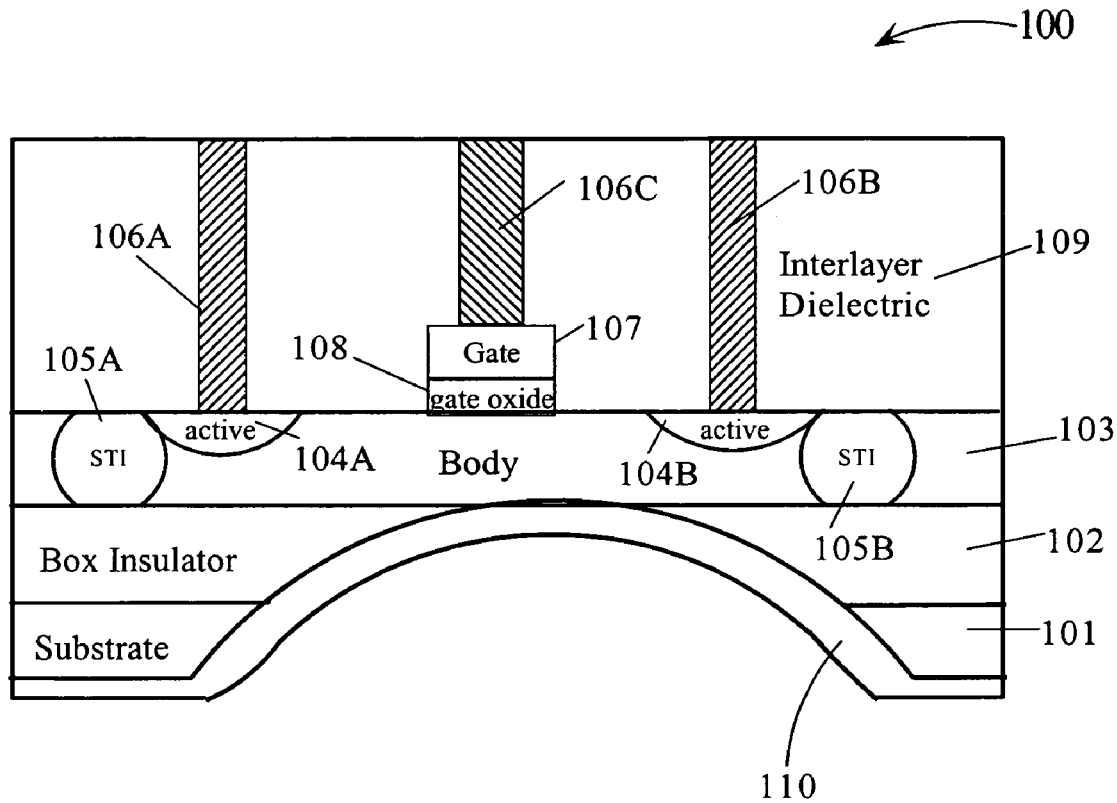
FIG. 3D illustrates an embodiment of the present invention of the SOI device after the step of applying a conductive layer using carbon ink.

In step 207, a carbon ink coating is applied to the etched portions of silicon 101 and box insulator 102 as well as to a portion of body 103 in order to form a good junction or ohmic contact with a sample holder or stage used in testing SOI device 100 with the passive voltage contrast technique as illustrated in FIG. 3D. Referring to FIG. 3D, it illustrates an embodiment of the present invention of SOI device 100 where a carbon ink coating 110 has been applied to the etch portions of substrate 101 and box insulator 102 as well as to a portion of body 103 in order to form a good junction or ohmic contact with a sample holder or stage used in testing SOI device 100 with the passive voltage contrast technique.

Returning to FIG. 2, in conjunction with FIG. 1, by etching portions of substrate 101 and box insulator 102 in steps 203–205, and applying a carbon ink coating layer 110 in step 207, a conductive path may now be formed from gate 107 to substrate 101 if there is a breakdown in gate oxide 108. Consequently, the passive voltage contrast technique, as discussed below, may be applied to SOI device 100 to detect a breakdown in gate oxide 108 which would be illustrated by a bright area resulting from the secondary electrons produced. If there is not a breakdown in gate oxide region 108, then the area surrounding gate oxide 108 will appear dark since there will not be a conductive path formed from gate 107 to ground level 110. Further, a conductive path may now be formed from contact 106 to substrate 101. The passive voltage contrast technique, as discussed below, may be applied to SOI device 100 to detect a contact 106 that is open which would be illustrated by a dark area around the defective contact region resulting from the lack of secondary electrons produced. If contact 106 is closed, then the area surrounding the contact region will appear bright since there will be a conductive path formed from the contact to the active area 104 of body 103 of SOI device 100.

In step 208, a beam of electrons is directed at SOI device 100 to detect a secondary emission from SOI device 100 during the testing of the device with the passive voltage contrast technique as illustrated in FIG. 4. Referring to FIG. 4, it illustrates an embodiment of the present invention of a passive voltage contrast chamber 300 used for detecting either a breakdown in gate oxide 108 of SOI device 100 or a contact 106 that is open. The passive voltage contrast technique may involve attaching SOI device 100 to a rotating stage 301 in vacuum chamber 300. Rotating stage 301 may include a support member 302 and a pivoting mechanism 303. Once SOI device 100 on stage 301 has been rotated into the appropriate location to test the area surrounding gate oxide 108, a scanning electron microscope (SEM) 304 may direct electrons to the gate oxide 108 area on SOI device 100 or to the region surrounding a contact 106. A detector 305 may be configured to detect any secondary electrons that may be produced by interconnected structures. That is, secondary electrons may be produced when there is a conductive path for electrons to flow. The areas of a conductive path may be brighter than the areas in which there is not a conductive path based on the amount of secondary electrons produced. Hence, by determining if the gate oxide region 108 is dark or bright, a determination may be made as to whether there is a breakdown in gate oxide region 108. If there is a breakdown in gate oxide region 108, then the gate oxide region 108 will appear to be bright. The area will appear bright since a conductive path has been formed from gate 107 to ground level 110 thereby resulting in secondary electrons being produced. If there is not a breakdown in gate oxide region 108, then the gate oxide region 108 will appear dark. Further, by determining if the area surrounding a contact 106 is dark or bright, a determination may be made as to whether contact 106 is open or closed. If contact 106 is closed, then the area will appear to be bright. The area will appear bright since a conductive path has been formed from contact 106 to active area 104 of body 103, thereby resulting in secondary electrons being produced. If contact 106 is open, then the area will appear dark around the defective contact due to the lack of secondary electrons being produced.

It is noted that one of ordinary skill in the art will readily recognize that method 200 may include other and/or additional steps that, for clarity, are not depicted. It is further noted that method 200 may be executed in a different order presented and that the order presented in the discussion of FIG. 2 is illustrative. It is further noted that certain steps in method 200, e.g., 202, and 206, are not necessary to be executed in order to perform the passive voltage contrast technique on SOI semiconductor device 100. Steps 202 and 206 may not be necessary if there is not a concern of protecting the top surface structures of SOI device 100 from inadvertent or undesirable etching.

Although the method and SOI device are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

What is claimed is:

1. A method for performing passive voltage contrast on a silicon on insulator (SOI) device comprising the steps of:

grinding a first portion of a substrate of said SOI device with a dimpling tool;

etching a second portion of said substrate of said SOI device with tetramethylammonium hydroxide (TMAH) following said grinding of said SOI device with said dimpling tool;

etching a third portion of said substrate and a portion of a box insulator of said SOI device with hydrofluoric acid (HF) following said etching of said SOI device with said TMAH;

applying a conductive coating to said etched second and third portions of said substrate and said box insulator of said SOI device;

applying said conductive coating to a portion of a body of said SOI device; and directing a beam of electrons at said SOI device to detect a secondary emission from said SOI device.

2. The method as recited in claim 1, wherein said beam of electrons is directed at a gate oxide area on said SOI device.

3. The method as recited in claim 2, wherein if said secondary emission results in said gate oxide area appearing brighter than areas in which there is not a conductive path then a breakdown in said gate oxide of said SOI device is indicated.

4. The method as recited in claim 2, wherein if said secondary emission results in said gate oxide area appearing dark then a breakdown in said gate oxide of said SOI device is not indicated.

5. The method as recited in claim 1, wherein said etching of said SOI device with said HF stops at a body of said SOI device.

6. The method as recited in claim 1 further comprising the step of:
polishing said SOI device to a first metal layer.

7. The method as recited in claim 6 further comprising the step of:
gluing a dummy integrated circuit to a top surface of said SOI device.

8. The method as recited in claim 7 further comprising the step of:
removing said dummy integrated circuit following etching said SOI device with said HF.

9. The method as recited in claim 1, wherein said conductive coating comprises a carbon ink coating.

10. A silicon on insulator (SOI) device, comprising:
a substrate, wherein a first portion of said substrate is ground using a dimpling tool, wherein a second portion of said substrate is etched using tetramethylammonium hydroxide (TMAH), wherein a third portion of said substrate is etched using hydrofluoric (HF) acid;
a box insulator overlaying said substrate, wherein a portion of said box insulator is etched using said HF acid;
a body overlaying said box insulator; and
a polysilicon gate separated from said body by a gate oxide;
wherein a beam of electrons is directed at an area of said gate oxide to determine if there is a breakdown in said gate oxide.

11. The SOI device as recited in claim 10, wherein said beam of electrons is directed at said gate oxide area to detect a secondary emission from said SOI device.

12. The SOI device as recited in claim 11, wherein if said secondary emission results in said gate oxide area appearing brighter than areas in which there is not a conductive path then a breakdown in said gate oxide of said SOI device is detected.

13. The SOI device as recited in claim 11, wherein if said secondary emission results in said gate oxide area appearing dark then a breakdown in said gate oxide of said SOI device is not detected.

14. The SOI device as recited in claim 10, wherein said body is not etched using said HF.

15. The SOI device as recited in claim 10, wherein a conductive coating is applied to said etched second and third portions of said substrate and said box insulator of said SOI device and applied to a portion of said body of said SOI device.

16. A silicon on insulator (SOI) device, comprising:
a substrate, wherein a first portion of said substrate is ground using a dimpling tool, wherein a second portion of said substrate is etched using tetramethylammonium hydroxide (TMAH), wherein a third portion of said substrate is etched using hydrofluoric (HF) acid;
a box insulator overlaying said substrate, wherein a portion of said box insulator is etched using said HF acid;
a body overlaying said box insulator; and
a contact interconnecting said body to a metal layer;
wherein a beam of electrons is directed at an area of said contact to determine if said contact is open.

17. The SOI device as recited in claim 16, wherein said beam of electrons is directed at said contact area to detect a secondary emission from said SOI device.

18. The SOI device as recited in claim 17, wherein if said secondary emission results in said contact area appearing brighter than areas in which there is not a conductive path then a closed contact is detected.

19. The SOI device as recited in claim 17, wherein if said secondary emission results in said contact area appearing dark then an open contact is detected.

20. The SOI device as recited in claim 16, wherein said body is not etched using said HF.

21. The SOI device as recited in claim 16, wherein a conductive coating is applied to said etched portions of said substrate and said box insulator of said SOI device and applied to a portion of said body of said SOI device.

22. A method for making a silicon on insulator (SOI) device suitable for performing passive voltage contrast comprising the steps of:
grinding a first portion of a substrate of said SOI device with a dimpling tool;
etching a second portion of said substrate of said SOI device with tetramethylammonium hydroxide (TMAH) following said grinding of said SOI device with said dimpling tool;
etching a third portion of said substrate and a portion of a box insulator of said SOI device with hydrofluoric acid (HF) following said etching of said SOI device with said TMAH;
applying a conductive coating to said etched second and third portions of said substrate and said box insulator of said SOI device; and
applying said conductive coating to a portion of a body of said SOI device.

* * * * *